(12) United States Patent
Nishikobara et al.

(10) Patent No.: US 7,010,444 B2
(45) Date of Patent: Mar. 7, 2006

(54) MEASURING APPARATUS AND MEASURING METHOD FOR PATTERN DEPENDENT JITTER

(75) Inventors: Tadanori Nishikobara, Atsugi (JP); Kazuhiko Ishibe, Samukawa-machi (JP)

(73) Assignee: Anritsu Corporation, Atsugi (JP)

( * ) Notice: Subject to any disclaimer, the term of this patent is extended or adjusted under 35 U.S.C. 154(b) by 76 days.

(21) Appl. No.: 10/736,811

(22) Filed: Dec. 15, 2003

(65) Prior Publication Data

US 2004/0143406 A1    Jul. 22, 2004

(30) Foreign Application Priority Data

Dec. 17, 2002    (JP)    ............................. 2002-365138

(51) Int. Cl.
*G06F 19/00*    (2006.01)
*G01R 13/00*    (2006.01)

(52) U.S. Cl. ..................... 702/69; 702/117; 714/740
(58) Field of Classification Search ................. 702/66, 702/69, 106, 124, 190, 117, 125; 714/740; 327/158; 375/226
See application file for complete search history.

(56) References Cited

U.S. PATENT DOCUMENTS

| 5,463,639 | A | * | 10/1995 | Koishi et al. ................ 714/740 |
| 5,757,652 | A | | 5/1998 | Blazo et al. |
| 6,622,107 | B1 | * | 9/2003 | West .......................... 702/117 |
| 2001/0012320 | A1 | | 8/2001 | Watanabe et al. |

FOREIGN PATENT DOCUMENTS

JP         5-145582 A    6/1993

OTHER PUBLICATIONS

Agilent: "Frequency Agile Jitter Measurement System" Application Note 1267, Online!, Aug. 22, 2002, XP002275149, Retrieved from the Internet: URL:http://cp.literature.agilent.com/litweb/pdf/5988-5610EN.pdf on Mar. 25, 2004.
Agilent: "Jitter Separation—50 Mb/s to Over 40 Gb/s Using the Agilent 86100C Infiniium DCA-J" Application Note, Online!, Dec. 9, 2003, XP002275150, Retrieved from the Internet: UR::http://we/home/agilent.com/upload/cmc_upload/All/ DCAjwhitepaper 3.pdf on Mar. 25, 2004.

* cited by examiner

*Primary Examiner*—Michael Nghiem
*Assistant Examiner*—John H. Le
(74) *Attorney, Agent, or Firm*—Frishauf, Holtz, Goodman & Chick, P.C.

(57)    ABSTRACT

A clock generating unit generates a clock signal having a predetermined frequency. A pattern generating unit outputs a data signal having a predetermined pattern in which one frame is configured from a predetermined bit length, so as to be synchronized with the clock signal. A waveform information acquiring unit receives the data signal as a data signal to be measured, and receives the clock signal, and acquires information of waveform in the same time domain of the data signal to be measured and the clock signal. An averaging processing unit carries out averaging processing on an acquired waveform. A phase difference detecting unit detects a phase difference of the data signal to be measured and the clock signal, for each bit, based on an averaged waveform information. A frequency band limiting processing unit carries out predetermined frequency band limiting processing on the per-bit phase difference information. A measured result outputting unit outputs the phase difference information as pattern dependent jitter.

19 Claims, 9 Drawing Sheets

MEASURING APPARATUS AND MEASURING METHOD FOR PATTERN DEPENDENT JITTER

CROSS-REFERENCE TO RELATED APPLICATIONS

This application is based upon and claims the benefit of priority from the prior Japanese Patent Application No. 2002-365138, filed Dec. 17, 2002, the entire contents of which are incorporated herein by reference.

BACKGROUND OF THE INVENTION

1. Field of the Invention

The present invention relates to a measuring apparatus and a measuring method for pattern dependent jitter, and in particular, to a measuring apparatus and a measuring method for pattern dependent jitter, in which a technique for measuring pattern dependent jitter which arises in dependence on a pattern of a data signal among jitter components included in the data signal.

2. Description of the Related Art

In a data transmission system, when fluctuation (jitter) in the phase of the data signal is large, the data signal cannot be normally transmitted.

Therefore, it is necessary to measure in advance the jitter characteristics of the data transmission system and equipment configuring the system.

FIG. 10 shows a configuration of a conventional jitter measuring apparatus 10 used for such an object.

In FIG. 10, a clock generating unit 11 outputs a clock signal CK having a predetermined frequency, and a pattern generating unit 12 outputs a data signal Dt which is synchronized with the clock signal CK, and which has a predetermined pattern having a predetermined bit (N) length.

A measuring object 1 is, for example, a clock/data recovery circuit used for a data transmission system.

The clock/data recovery circuit serving as the measuring object 1 outputs the data signal Dt from the pattern generating unit 12, as a data signal Dr.

The data signal Dr outputted from the measuring object 1 is inputted to a waveform observing device 13 as a data signal to be measured.

The waveform observing device 13 displays waveform of the inputted data signal Dr to be measured as will be described later.

Namely, the waveform observing device 13 divides the clock signal CK by P (here, P is a number less than the data length N of the data signal Dt), and displays so as to overwrite waveform of the data signal Dr to be measured due to the level displacement timing of the divided signal being made to be the trigger timing.

At this time, when a pattern of the data signal Dt is random, for example, as shown in FIG. 11, waveform in which a rise and a fall intersect is displayed on the waveform observing device 13.

This waveform is called eye-pattern, and when jitter in the data signal Dr to be measured is large, a width W of the intersection of the rise and the fall of the eye-pattern is made large.

Accordingly, a jitter amount of the data signal Dr to be measured can be grasped in accordance with the width W of the intersection of the eye-pattern displayed on the waveform observing device 13.

Note that a method for determining jitter by observing the eye-pattern of a data signal as described above is described in, for example, Patent document 1 (Jpn. Pat. Appln. KOKAI Publication No. 5-145582).

However, in the method for measuring jitter based on the width W of the eye-pattern displayed on the waveform observing device 13 as described above, pattern dependent jitter which arises in dependence on a pattern of a data signal cannot be grasped.

Namely, as jitters, there are random noise jitter arising due to noise of equipment themselves, external noise, or the like, and pattern dependent jitter arising due to a pattern of a data signal which is transmitted.

The pattern dependent jitter is jitter arising due to waveform distortion generated because a DC component cannot pass through when a data transmission passing band of the measuring object 1 is high (several GHz), duty cycle distortion of a data signal, waveform distortion generated because the frequency characteristic of the measuring object 1 is not sufficient for a frequency of the signal which is transmitted, or the like.

This pattern dependent jitter is not a serious problem when a data signal has strong random characteristic such as a pseudo-random pattern.

However, in a case where the data signal having the predetermined pattern is a data signal in which an unscrambled specific pattern always exists at the head position, such as a frame actually used for data transmission, for example, an SDH frame or a SONET frame, large pattern dependent jitter arises at the frame intervals (for example, 125 μs intervals).

Moreover, because the frequency of the pattern dependent jitter arising at this frame intervals is generally within a frequency band stipulated by jitter measurement, the pattern dependent jitter cannot be measured in distinction from other random noise jitter.

Further, in measurement of jitter in dependence on a pattern of a data signal as described above, it is necessary to exactly grasp the relation between the position of data and jitter.

However, it is difficult to exactly grasp the relation in the eye-pattern observation as described above.

Therefore, in the measurement of pattern dependent jitter, realization of a measuring apparatus for pattern dependent jitter and a jitter measuring method which can exactly grasp the relation between the position of data and jitter has been strongly desired.

BRIEF SUMMARY OF THE INVENTION

An object of the present invention is to provide a measuring apparatus and a measuring method for pattern dependent jitter which can exactly grasp the relation between the position of data and jitter in measurement of pattern dependent jitter.

In order to achieve the above object, according to a first aspect of the present invention, there is provided a pattern dependent jitter measuring apparatus comprising:

a clock generating unit which generates a clock signal having a predetermined frequency; and a pattern generating unit which outputs a data signal having a predetermined pattern in which one frame is configured from a predetermined bit length, so as to be synchronized with the clock signal outputted from the clock signal generating unit, wherein the pattern dependent jitter measuring apparatus further comprises:

a waveform information acquiring unit which receives the data signal outputted from the pattern generating unit as a data signal to be measured, and receives the clock signal outputted from the clock generating unit, and which acquires information of waveform in the same time domain of the data signal to be measured and the clock signal;

an averaging processing unit which carries out averaging processing on the waveform acquired by the waveform information acquiring unit;

a phase difference detecting unit determining the per-bit phase difference between the data signal to be measured and the clock signal, based on the waveform information averaged by the averaging processing unit;

a frequency band limiting processing unit which carries out predetermined frequency band limiting processing on information of the per-bit phase difference obtained by the phase difference detecting unit; and a measured result outputting unit which outputs the phase difference information on which the frequency band limiting processing is carried out by the frequency band limiting processing unit, as pattern dependent jitter.

In order to achieve the above object, according to a second aspect of the present invention, there is provided a pattern dependent jitter measuring apparatus according to the first aspect, wherein the pattern generating unit is configured to include a data signal in which an unscrambled specific pattern exists at a head position of each frame, as the data signal outputted from the pattern generating unit.

In order to achieve the above object, according to a third aspect of the present invention, there is provided a pattern dependent jitter measuring apparatus according to the first aspect, wherein the waveform information acquiring unit is configured to receive a data signal to be outputted by a measuring object which has received the data signal outputted from the pattern generating unit, as the data signal to be measured, and receive a clock signal outputted from the clock generating unit, and acquire waveform information in the same time domain of the data signal to be measured and the clock signal.

In order to achieve the above object, according to a fourth aspect of the present invention, there is provided a pattern dependent jitter measuring apparatus according to the third aspect, wherein the measuring object includes equipment configured such that, when pattern dependent jitter is included in a data signal to be inputted, a pattern dependent jitter component included in the inputted data signal can be removed by waveform shaping processing at the inside thereof, and a data signal including random noise jitter and pattern dependent jitter which the measuring object itself internally generates is outputted to the waveform information acquiring unit as the data signal to be measured.

In order to achieve the above object, according to a fifth aspect of the present invention, there is provided a pattern dependent jitter measuring apparatus according to the first aspect, wherein the pattern generating unit is configured to output a frame synchronization signal synchronized with data output timing at an arbitrary bit position in one frame of the data signal, to the waveform information acquiring unit, and the waveform information acquiring unit is configured to acquire a predetermined number of frames of the waveform information of the data signal to be measured and the clock signal by using the timing when the frame synchronization signal is inputted as a standard timing.

In order to achieve the above object, according to a sixth aspect of the present invention, there is provided a pattern dependent jitter measuring apparatus according to the fifth aspect, wherein the averaging processing unit is configured to determine one frame of waveform information of the clock signal and the data signal to be measured from each of which the random noise jitter component has been removed, by averaging the predetermined number of frames of waveform information which are acquired by the waveform information acquiring unit.

In order to achieve the above object, according to a seventh aspect of the present invention, there is provided a pattern dependent jitter measuring apparatus according to the sixth aspect, wherein the phase difference detecting unit is configured such that a phase difference (time difference) $\Delta T(i)$ between level displacement timing of the clock signal which is determined by the averaging processing unit, and from which the random noise jitter component has been removed, and a code boundary of the data signal to be measured, is determined for each bit, and such that per-bit phase difference $\Delta T(i)'$ is determined by $\Delta T(1)'=0$, and $\Delta T(i)'=\Delta T(i)-\Delta T(1)$ $(i=2, 3, \ldots, N)$, by correcting the phase differences $\Delta T(2), \Delta T(3) \ldots, \Delta T(N)$ from the second bit on by the bit difference $\Delta T(1)$ of the first bit.

In order to achieve the above object, according to an eighth aspect of the present invention, there is provided a pattern dependent jitter measuring apparatus according to the seventh aspect, wherein the phase difference detecting unit is configured such that detection of the level displacement timing is carried out after it is judged whether or not an amplitude of the data signal to be measured that is determined by the averaging processing unit exceeds a threshold value.

In order to achieve the above object, according to a ninth aspect of the present invention, there is provided a pattern dependent jitter measuring apparatus according to the seventh aspect, wherein the phase difference detecting unit detects timing only when a code of the data signal to be measured determined by the averaging processing unit is changed, with respect to the detection of level displacement timing, and determines a time difference between the timing and the level displacement timing of the clock signal as a phase difference.

In order to achieve the above object, according to a tenth aspect of the present invention, there is provided a pattern dependent jitter measuring apparatus according to the seventh aspect, wherein the phase difference detecting unit is configured such that, when the code of the data signal to be measured determined by the averaging processing unit is not changed, with respect to the detection of level displacement timing, a phase difference of the previous bit is allocated.

In order to achieve the above object, according to an eleventh aspect of the present invention, there is provided a pattern dependent jitter measuring apparatus according to the first aspect, wherein the frequency band limiting processing unit is configured to include a digital filter formed by digital signal processing means.

In order to achieve the above object, according to a twelfth aspect of the present invention, there is provided a pattern dependent jitter measuring apparatus according to the first aspect, wherein the waveform information acquiring unit and the averaging processing unit are configured from a sampling oscilloscope.

In order to achieve the above object, according to a thirteenth aspect of the present invention, there is provided a pattern dependent jitter measuring method comprising:

outputting a data signal which is synchronized with a clock signal having a predetermined frequency, and has a predetermined pattern of a predetermined bit length, wherein the pattern dependent jitter measuring method further comprises:

receiving the data signal as a data signal to be measured, and receiving the clock signal, thereby to acquiring waveform information in the same time domain of the data signal to be measured and the clock signal;

carrying out averaging processing on the waveform acquired by the acquiring of the waveform information;

detecting phase differences of the data signal to be measured and the clock signal, for each bit of the data signal to be measured, based on the waveform information obtained by the averaging processing;

carrying out predetermined frequency band limiting processing on the phase difference information detected for each bit; and outputting the phase difference information on which the predetermined frequency band limiting processing is carried out, as pattern dependent jitter.

In order to achieve the above object, according to a fourteenth aspect of the present invention, there is provided a pattern dependent jitter measuring method according to the thirteenth aspect, wherein the outputting of a data signal outputs a data signal in which an unscrambled pattern exists at a head portion of each frame, as the data signal.

In order to achieve the above object, according to a fifteenth aspect of the present invention, there is provided a pattern dependent jitter measuring method according to the thirteenth aspect, wherein the method further comprises:

inputting the data signal which is synchronized with a clock signal having a predetermined frequency, and which has a predetermined pattern of a predetermined bit length, to a measuring object, and the acquiring of the waveform information receives a data signal outputted from the measuring object which has received the data signal, as the data signal to be measured, and receives the clock signal, and carries out the acquiring of the waveform information in the same time domain of the data signal to be measured and the clock signal.

In order to achieve the above object, according to a sixteenth aspect of the present invention, there is provided a pattern dependent jitter measuring method according to the fifteenth aspect, wherein the measuring object includes equipment configured such that, when the pattern dependent jitter is included in a signal to be inputted, a pattern dependent jitter component included in the inputted data signal can be removed by waveform shaping processing at the inside thereof, and a data signal including random noise jitter and pattern dependent jitter which the measuring object itself internally generates, is outputted as the data signal to be measured.

In order to achieve the above object, according to a seventeenth aspect of the present invention, there is provided a pattern dependent jitter measuring method according to the thirteenth aspect, wherein the method further comprises:

outputting a frame synchronization signal synchronized with data output timing at an arbitrary bit position in one frame of the data signal, and the acquiring of the waveform information acquires a predetermined number of frames of waveform information of the data signal to be measured and the clock signal by using timing when the frame synchronization signal is inputted as a standard timing.

In order to achieve the above object, according to an eighteenth aspect of the present invention, there is provided a pattern dependent jitter measuring method according to the seventeenth aspect, wherein the averaging processing determines one frame of waveform information of the clock signal and the data signal to be measured from each of which the random noise jitter component has been removed, by averaging the predetermined number of frames of waveform information acquired by the acquisition of waveform information.

In order to achieve the above object, according to a nineteenth aspect of the present invention, there is provided a pattern dependent jitter measuring method according to the eighteenth aspect, wherein the detecting of the phase difference detects a phase difference (time difference) $\Delta T(i)$ between level displacement timing of the clock signal which is determined by the averaging processing unit, and from which the random noise jitter component has been removed, and a code boundary of the data signal to be measured, for each bit, and determines per-bit phase difference $\Delta T(i)'$ by $\Delta T(1)'=0$, and $\Delta T(i)'=\Delta T(i)-\Delta T(1)$ $(i=2, 3, \ldots, N)$, by correcting phase differences $\Delta T(2), \Delta T(3), \ldots, \Delta T(N)$ from the second bit on by the bit difference $\Delta T(1)$ of the first bit.

In order to achieve the above object, according to a twentieth aspect of the present invention, there is provided a pattern dependent jitter measuring method according to the eighteenth aspect, wherein the detecting of the phase difference is configured such that detection of the level displacement timing is carried out after it is judged whether or not an amplitude of the data signal to be measured determined by the averaging processing exceeds a threshold value.

In order to achieve the above object, according to a twenty-first aspect of the present invention, there is provided a pattern dependent jitter measuring method according to the eighteenth aspect, wherein the detecting of the phase difference detects timing only when a code of the data signal to be measured determined by the averaging processing is changed, with respect to the detection of level displacement timing, and determines a time difference between the timing and the level displacement timing of the clock signal as a phase difference.

In order to achieve the above object, according to a twenty-second aspect of the present invention, there is provided a pattern dependent jitter measuring method according to the eighteenth aspect, wherein the detecting of the phase difference is configured such that, when the code of the data signal to be measured determined by the equalization processing is not changed, with respect to the detection of level displacement timing, a phase difference of the previous bit is allocated.

In order to achieve the above object, according to a twenty-third aspect of the present invention, there is provided a pattern dependent jitter measuring method according to the thirteenth aspect, wherein the acquiring of the waveform information and the averaging processing are carried out by a sampling oscilloscope.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the invention.

DETAILED DESCRIPTION OF THE INVENTION

Figure 1:
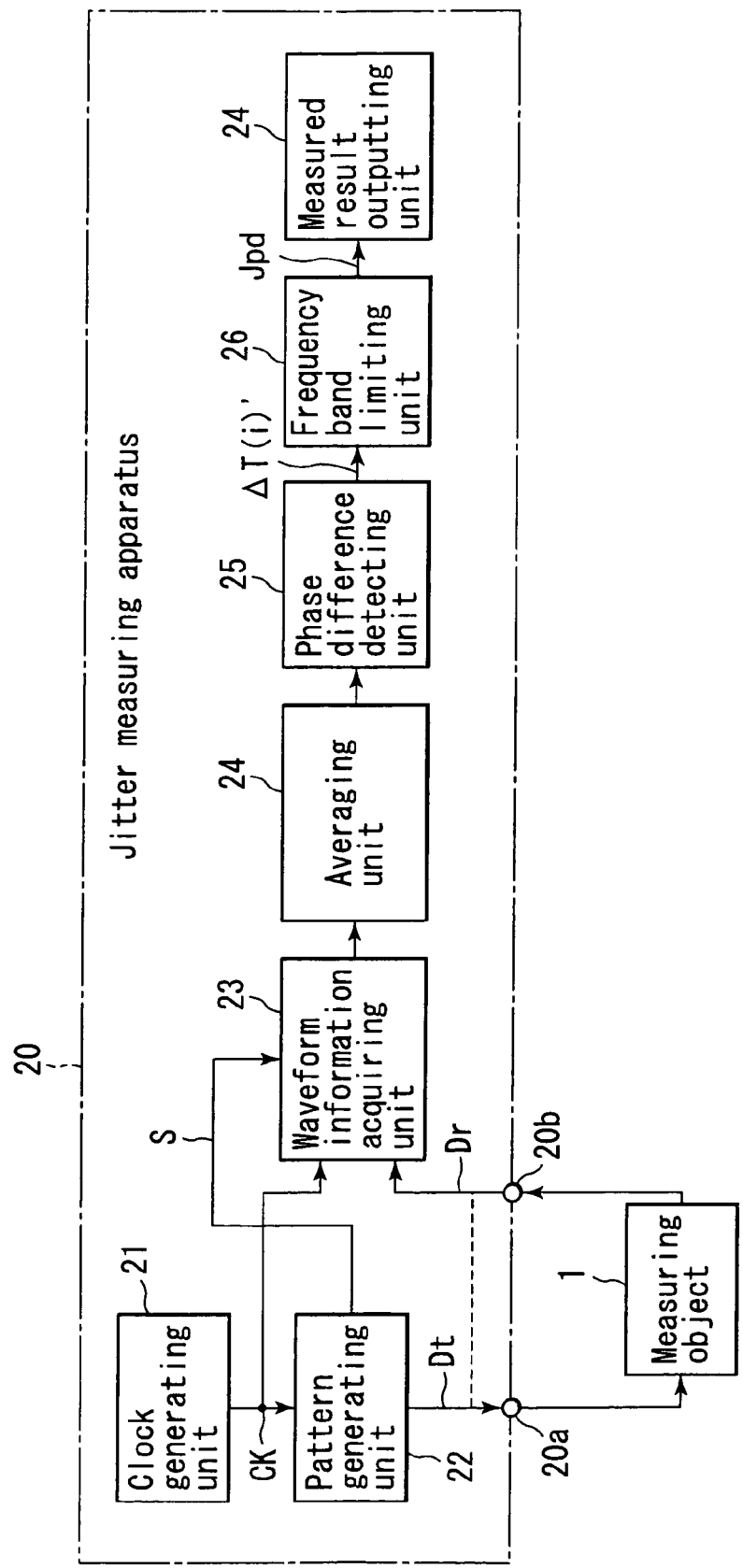
FIG. 1 is a block diagram showing a configuration of a first embodiment of a jitter measuring apparatus according to the invention and a modified example thereof.

Reference will now be made in detail to the presently preferred embodiments of the invention as illustrated in the accompanying drawings, in which like reference numerals designate like or corresponding parts.

Hereinafter, embodiments of the present invention will be described with reference to the drawings.

(First Embodiment)

FIG. 1 is a block diagram showing a basic configuration as a jitter measuring apparatus 20 according to a first embodiment to which the present invention is applied, and a modified example thereof.

In FIG. 1, a clock generating unit 21 outputs a clock signal CK having a predetermined frequency corresponding to a data transmission rate of a measuring object 1 (for example, about 2.5 Gbps or about 9.95 Gbps).

A pattern generating unit 22 repeatedly outputs a data signal Dt having a predetermined pattern in which one frame (for example, the SDH/SONET frame described above) is configured from a predetermined bits N so as to synchronize with the clock signal CK.

In the case where the data signal Dt having the predetermined pattern is a data signal in which an unscrambled specific pattern always exists at the head position, such as a frame actually used for data transmission, for example, an SDH frame or a SONET frame, large pattern dependent jitter arises at the frame intervals (for example, 125 $\mu$s intervals).

Further, the pattern generating unit 22 outputs a frame synchronization signal S synchronizing with the data output timing at a predetermined bit position (for example, the head position) of the data signal Dt repeatedly outputted thereby.

Note that, here, the data signal Dt is an electric signal. However, the data signal Dt may be an optical data signal as will be described later.

Further, the above-described clock generating unit 21 and pattern generating unit 22 can be configured from an integrated-type pattern generator having the functions thereof.

A data signal outputted by such an integrated-type pattern generator may be any of an electric signal and an optical signal as described above.

The data signal Dt from the pattern generating unit 22 is inputted to the measuring object 1 via an output terminal 20a.

The measuring object 1 is various types of equipment used for a data transmission system, and here, the meaning object 1 will be described by using the case of a clock/data reproducer which waveform-shapes and outputs the data signal Dt in the same way as in the above description.

A data signal Dr to be measured outputted from the measuring object 1 is inputted to a waveform information acquiring unit 23 via an input terminal 20b.

The waveform information acquiring unit 23 acquires plural (M) frames of waveform information (for example, M=16) in the same time domain of the data signal Dr to be measured and the clock signal CK based on the input timing of the frame synchronization signal S.

An averaging processing unit 24 carries out averaging processing on the degree M with respect to the waveform acquired by the waveform information acquiring unit 23.

Due to this averaging processing, the random noise jitter components included in the data signal Dr to be measured and the clock signal CK are eliminated, and only the components of pattern dependent jitters remain.

The waveform information acquiring unit 23 and the averaging processing unit 24 can be configured by using a digital sampling oscilloscope as will be described later.

Based on the waveforms of the data signal Dr to be measured and the clock signal CK averaged by the averaging processing unit 24, a phase difference detecting unit 25 determines one frame (N bits) of the data signal Dr to be measured by using, as the unit of time, the phase difference, per bit, between the data signal Dr to be measured and the clock signal CK.

A frequency band limiting processing unit 26 carries out frequency band limiting processing which is determined in advance due to the above-described bit rate by using, for example, a DSP or the like, with respect to information of the phase difference for each bit detected by the phase difference detecting unit 25.

For example, in the case of the SDH/SONET described above, when a transmission rate is about 2.5 Gbps, the frequency band limiting processing of any of 5 kHz to 20 MHz, 12 kHz to 20 MHz, and 1 MHz to 20 MHz is carried out by the frequency band limiting processing unit 26.

Further, when a transmission rate is about 9.95 Gbps, the frequency band limiting processing of any of 20 kHz to 80 MHz, 50 kHz to 80 MHz, and 4 MHz to 80 MHz is carried out by the frequency band limiting processing unit 26.

A measured result outputting unit 27 is configured from a transmitter for carrying out transmission of information to an indicator, a printer, or an external device, or the like, and the information of the phase differences to which frequency band limiting processing is applied by the frequency band limiting processing unit 26 is display-outputted, printed-out, or outputted to an external device, as a pattern dependent jitter Jdp which the measuring object 1 generates with respect to the data signal Dt.

Next, the operations of the jitter measuring apparatus 20 according to the first embodiment in this way will be described based on timing charts shown in FIGS. 2A to 2F.

Figure 2:
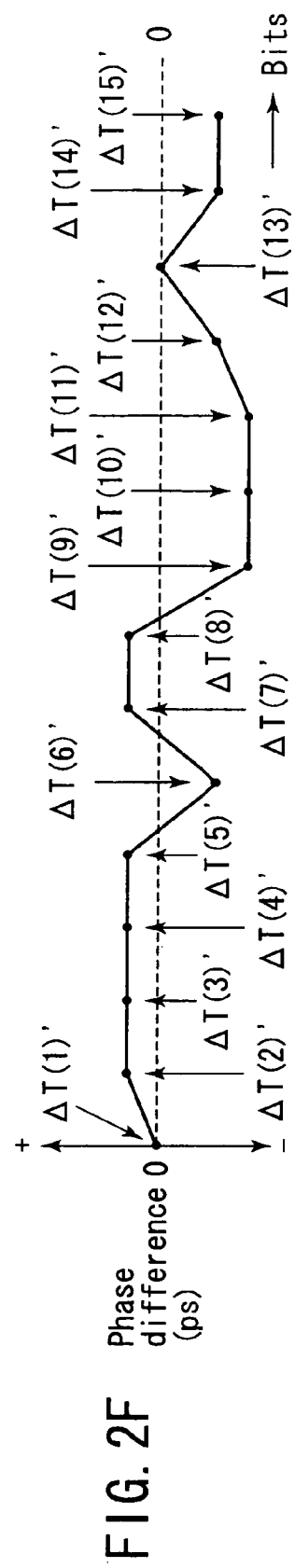
FIGS. 2A to 2F are timing charts shown for explanation of operations of the jitter measuring apparatus of FIG. 1.

With respect to the clock signal CK, as shown in FIG. 2B, which is outputted from the clock generating unit 21, the frame synchronization signal S and the data signal Dt (not showed, and for example, the SDH frame data described above) as shown in FIG. 2A are outputted from the pattern generating unit 22.

The data signal Dr to be measured as shown in FIG. 2C is outputted from the measuring object 1 which has received the data signal Dt.

Note that random noise jitters Jn are included in the clock signal CK, the data signal Dt, the data signal Dr to be measured, and the frame synchronization signal S.

Further, there are cases in which pattern dependent jitter is included in the data signal Dt inputted to the measuring object 1. However, the component of the pattern dependent jitter included in the data signal Dt is eliminated due to the waveform shaping processing at the inside of the clock/data reproducer serving as the measuring object 1.

Accordingly, the random noise jitter and the pattern dependent jitter which the measuring object 1 itself (outputting portion) generates are included in the data signal Dr to be measured.

Such a data signal Dr to be measured is inputted to the waveform information acquiring unit 23 together with the clock signal CK outputted from the clock generating unit 21, and the waveform information (information regarding the amplitude values of each time) in the same time domain of the both signals are acquired.

Here, the waveform information acquiring unit 23 carries out, for example, processing in which the waveform information of the data signal Dr to be measured and the clock signal CK which are inputted during the time from the timing based on the timing when the frame synchronization signal S is inputted until the next frame synchronization signal S is inputted, are acquired, with respect to M frames thereof.

The averaging processing unit 24 determines one frame of waveform information (only a portion of which is shown in FIGS. 2D and 2E) of the clock signal CK' and the data signal Dr' to be measured from each of which the random noise jitter component has been removed as shown in FIGS. 2D and 2E, by equalizing the M frames of the waveform information acquired by the waveform information acquiring unit 23.

As shown in FIG. 2F, the phase difference detecting unit 25 determines a phase difference (time difference) ΔT(i) between the level displacement timing (here, fall edge) of the clock signal CK' from which the random noise jitter component has been removed and a code boundary of the data signal Dr' to be measured from which the random noise jitter component has been removed, for each bit, and a phase difference ΔT(i)' for each bit is determined as follows by correcting the phase differences ΔT(2), ΔT(3), ..., ΔT(N) from the second bit on by the bit difference ΔT(1) of the first bit.

$$\Delta T(1)'=0$$

$$\Delta T(i)'=\Delta T(i)-\Delta T(1) \ (i=2, 3, \ldots, N)$$

Note that detection of each timing is carried out after it is judged whether or not a signal amplitude exceeds a threshold value. However, when the code of the data signal Dr' to be measured does not vary (the same code continues), it is difficult to detect the timing of the code boundary from the waveform.

Then, actually, only when the code of the data signal Dr' to be measured varies, the timing is detected, and a time difference between the timing and the level displacement timing of the clock signal CK' is determined as a phase difference.

Furthermore, when the code of the data signal Dr' to be measured does not vary, a phase difference of the previous bit is allocated thereto.

Figure 3:
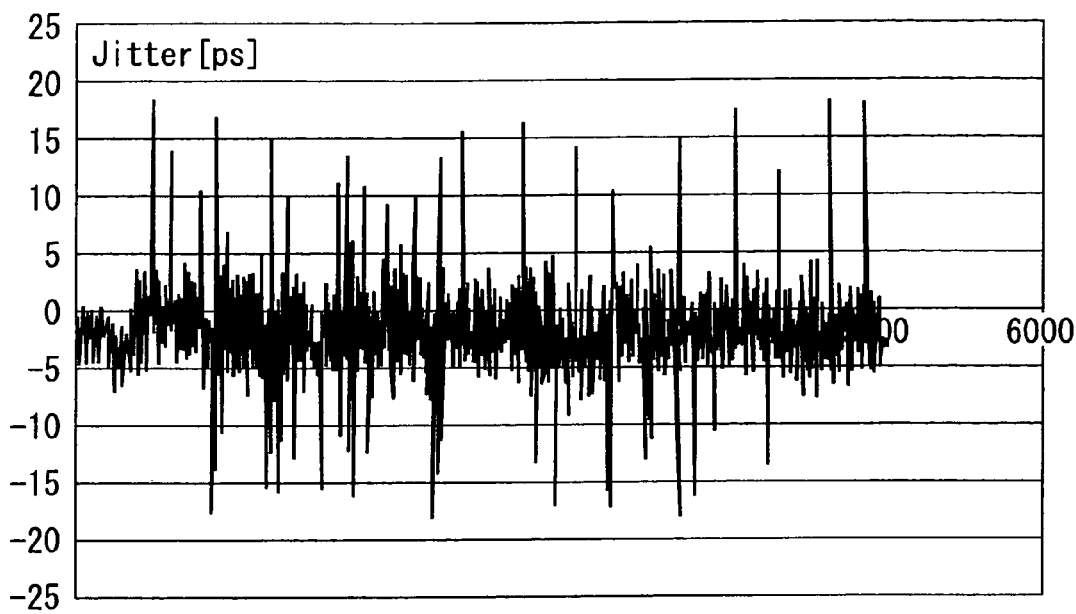
FIG. 3 is a graph showing jitter waveform before frequency band limiting processing in the jitter measuring apparatus of FIG. 1.

The information of the phase differences ΔT(1)', ΔT(2)', ..., ΔT(N)' for one frame obtained in this way are generated due to the pattern dependent jitter, and when one frame of pattern dependent jitter is determined, for example, jitter waveform such as shown in FIG. 3 is obtained.

Figure 4:
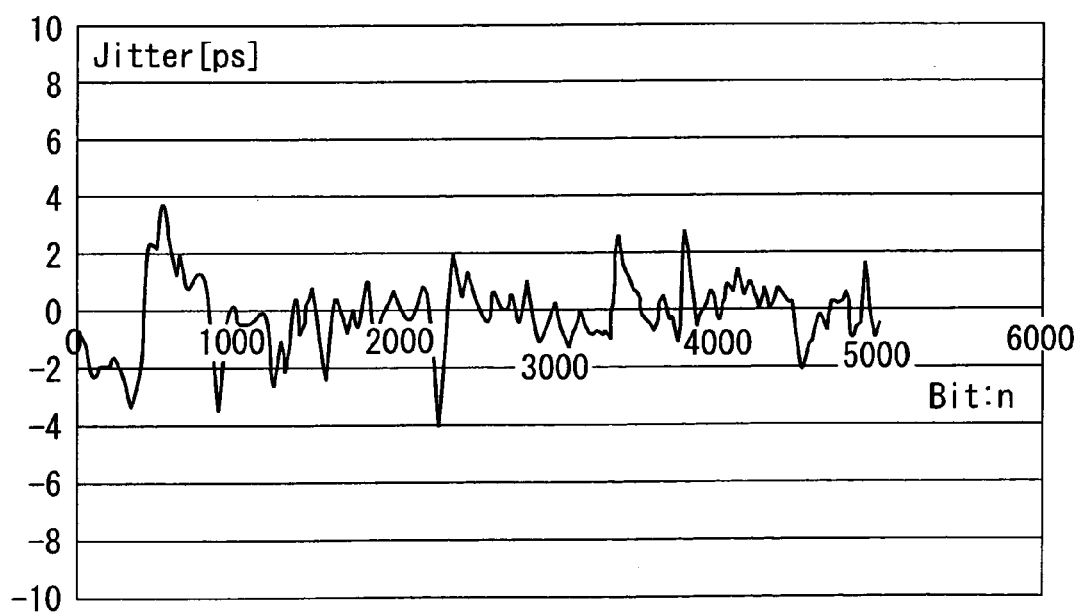
FIG. 4 is a graph showing jitter waveform after frequency band limiting processing in the jitter measuring apparatus of FIG. 1.

For example, frequency band limiting processing of 4 MHz to 80 MHz corresponding to a bit rate of about 9.95 Gbps is carried out with respect to the jitter waveform by the frequency band limiting processing unit 26, jitter waveform such as shown in FIG. 4 is obtained.

The jitter waveform due to this frequency band limiting processing has been obtained by converting the jitter waveform for each bit of FIG. 3 into jitter waveform on the time base based on a bit rate, and by carrying out the above-described frequency band limiting by a digital filter.

It can be understood that large pattern dependent jitter arises at the head portion of the jitter waveform due to an unscrambled specific pattern at the head portion of the SDH/SONET frame.

As shown in FIG. 4, the measured result outputting unit 27 displays the waveform of the jitter on which the frequency band limiting processing has been carried out, on a screen as the pattern dependent jitter which the measuring object 1 generates with respect to the data signal Dr, prints it out, or transmits it to another device.

Note that, other than being expressed by using the phase difference as the unit of time as described above, the measured results may be converted into UIpp (unit interval) units and outputted.

Figure 5:
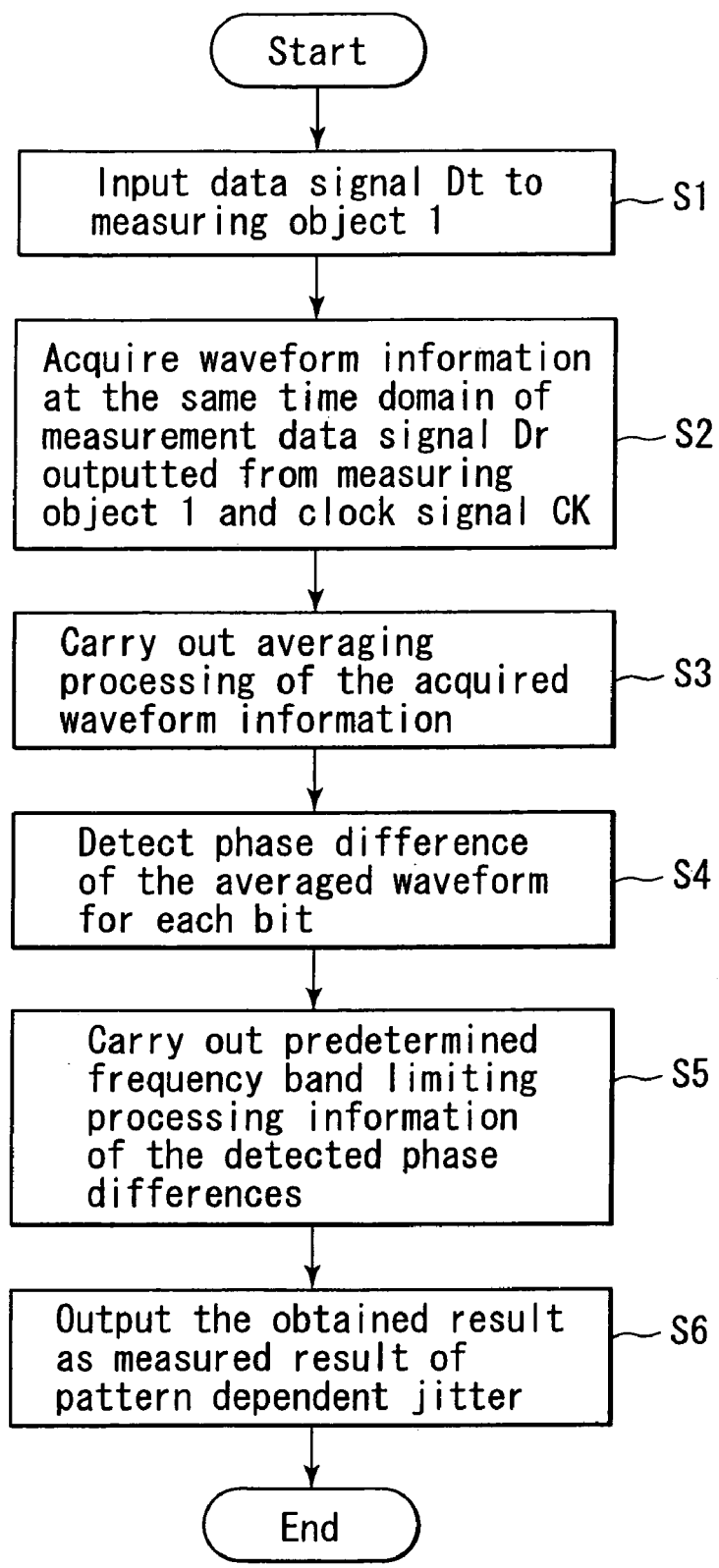
FIG. 5 is a flowchart shown for explanation of measuring processing procedure of the jitter measuring apparatus of FIG. 1.

FIG. 5 is a flowchart shown for explanation of the procedure of a method for measuring pattern dependent jitter according to the first embodiment described above.

First, the data signal Dt having a predetermined N-bit length pattern synchronizing with the clock signal CK having a predetermined frequency outputted from the clock generating unit 21 is provided from the pattern generating unit 22 to the measuring object 1 (step S1).

Next, information of the waveforms in the same time domain of the data signal Dr to be measured outputted from the measuring object 1 and the clock signal CK outputted from the clock generating unit 21 are acquired by the waveform information acquiring unit 23 (step S2)

Further, averaging processing is carried out on the waveform acquired by the waveform information acquiring unit 23 by the averaging processing unit 24, and whereby random noise jitters are eliminated therefrom (step S3).

Next, the phase difference detecting unit 25 determines the phase differences ΔT(i)' between the clock signal CK' and the data signal Dr' to be measured, for one frame, for each bit of the data signal to be measured, based on the waveforms obtained due to the averaging processing by the averaging processing unit 24 (step S4).

Subsequently, the frequency band limiting processing unit 26 carries out a predetermined frequency band limiting processing on one frame of the phase difference information determined by the phase difference detecting unit 25 (step S5).

Next, the measured result outputting unit 27 determines the pattern dependent jitter of the measuring object 1, and outputs it as a measured result (step S6).

In this way, the jitter measuring apparatus 20 and measuring method according to the first embodiment measure pattern dependent jitter by acquiring waveform information in the same time domain of the data signal Dr to be measured outputted from the measuring object 1 and the clock signal CK; removing the random noise jitter component by equalizing the waveform information; determining, for one frame, the per-bit phase difference of the clock signal CK' and the data signal Dr' to be measured from which the noise jitter has been removed; and carrying out predetermined frequency band limiting processing on this phase difference information.

Therefore, the jitter measuring apparatus 20 and measuring method according to the first embodiment can exactly measure only the pattern dependent jitter, which has been impossible in the eye-pattern observation of a prior art.

Further, the jitter measuring apparatus 20 and measuring method in accordance with the first embodiment can easily grasp the relation between the position of a data signal and pattern dependent jitter, which has been impossible in the eye-pattern observation of the prior art.

Note that, as a modified example of the jitter measuring apparatus 20 and measuring method according to the first embodiment, as shown by the broken line in FIG. 1, the case where the apparatus is configured such that the data signal Dt from the pattern generating unit 22 is directly inputted to the waveform information acquiring unit 23 as the data signal Dr' to be measured, without being inputted to the measuring object 1 via the output terminal 20a, can be thought.

Namely, the jitter measuring apparatus 20 according to the modified example is applied to a case where the pattern dependent jitter of the data signal Dr to be measured outputted from the measuring object 1 is not measured, and due to the data signal Dt from the pattern generating unit 22 in the jitter measuring apparatus 20 being made to be the data signal Dr' to be measured, the pattern dependent jitter of the data signal Dr' to be measured is measured.

Because the jitter measuring apparatus 20 according to the modified example is a technique applied to the case where the pattern dependent jitter of the data signal Dr' to be measured is measured due to the data signal Dt from the pattern generating unit 22 in the jitter measuring apparatus 20 being made to be the data signal Dr' to be measured, namely, there is the merit that a traceability function as an internal standard can be provided therein.

(Second Embodiment)

The above description of the jitter measuring apparatus in accordance with the first embodiment is described with respect to the basic configuration of the present invention. However, next, a configuration example of a further concrete jitter measuring apparatus as a second embodiment of the present invention will be described.

Figure 6:
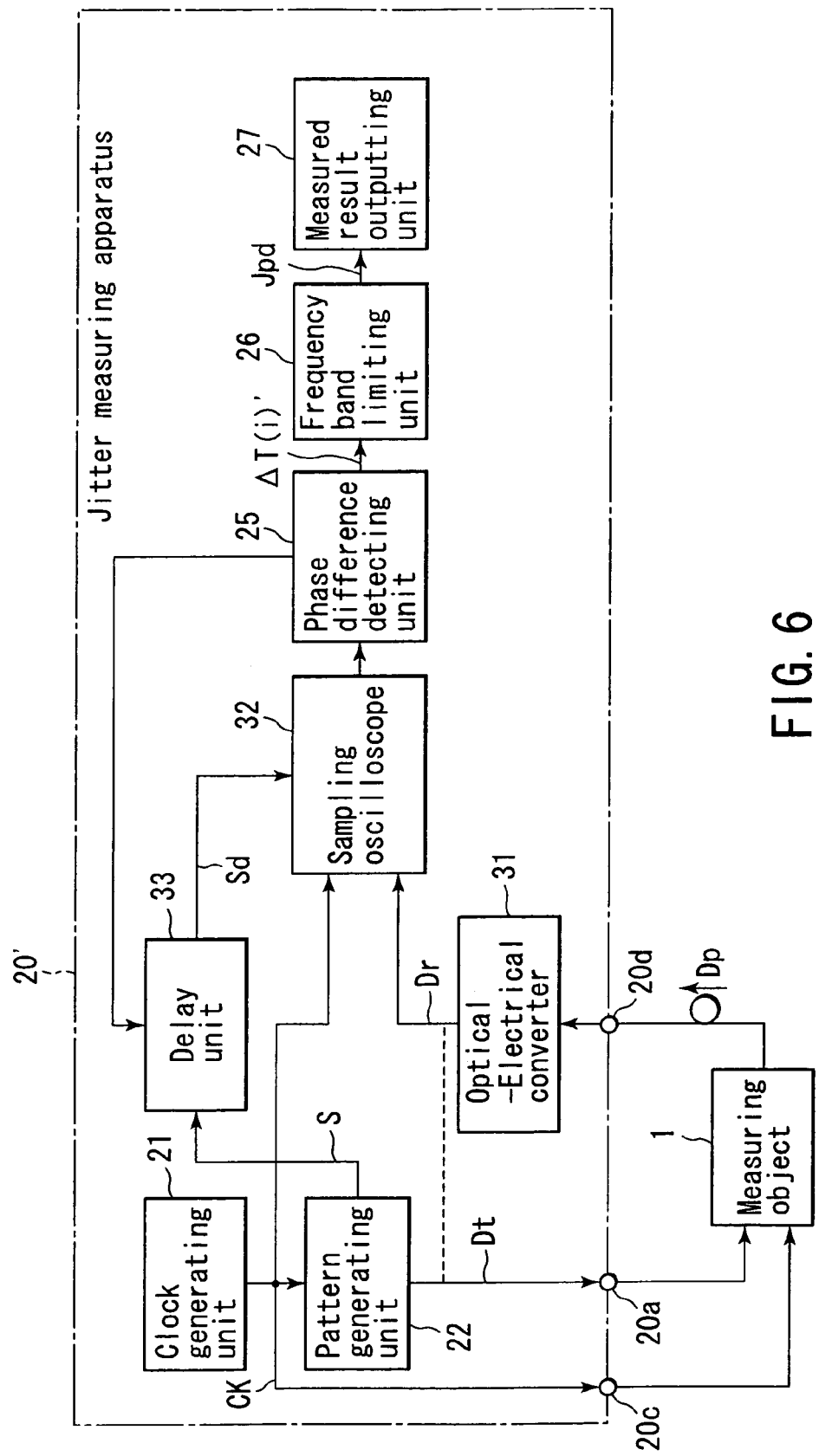
FIG. 6 is a block diagram showing a configuration of a second embodiment of a jitter measuring apparatus according to the invention.

FIG. 6 is a block diagram showing a configuration as the second embodiment and a modified example thereof of the jitter measuring apparatus according to the invention.

A jitter measuring apparatus 20' shown in FIG. 6 is an apparatus in which an light transmitter (an Electrical-Optical converter) which converts an electric data signal into an optical data signal, and emits it, is made to serve as a measuring object 1.

The jitter measuring apparatus 20' provides the electric data signal Dt from the pattern generating unit 22 via the output terminal 20a to the measuring object 1, and provides the clock signal CK from the clock generating unit 21 via the output terminal 20c to the measuring object 1.

In a case of this type of measuring object 1, namely, the light transmitter (an Electrical-Optical converter) delays the clock signal CK at the inside thereof so as to be not affected with jitter of a data signal generally inputted, and carries out waveform shaping of the data signal Dt by using the delayed clock signal, and emits an optical data signal Dp to be measured obtained due to intensity of light being modulated by the waveform-shaped signal.

Accordingly, even if pattern dependent jitter is included in the data signal Dt outputted from the pattern generating unit 22, the jitter component is made small enough to be ignored due to the above-described waveform shaping processing in the measuring object 1, the pattern dependent jitter included in the data signal Dp to be measured outputted from the measuring object 1 can be considered as the jitter which arose at the measuring object 1 itself (mainly, a modulating portion or an outputting portion).

The jitter measuring apparatus 20' receives the optical data signal Dp to be measured at an input terminal 20d, and converts the data signal Dp to be measured into the electric data signal Dr to be measured by an Optical-Electrical converter 31.

Note that, as will be described later, when the sampling oscilloscope 32 has a function that an optical signal is directly received, and is Optical-Electrical converted at the inside thereof, the Optical-Electrical converter 31 is omitted, and the optical data signal Dp to be measured can be directly inputted to the sampling oscilloscope 32.

In the jitter measuring apparatus 20', in place of the above-described waveform information acquiring unit 23 and averaging unit 24 in the first embodiment, the digital sampling oscilloscope 32 having a function of acquiring waveform information of a high-speed data signal, and a function of averaging processing on the acquired waveform, is used.

Figure 7:
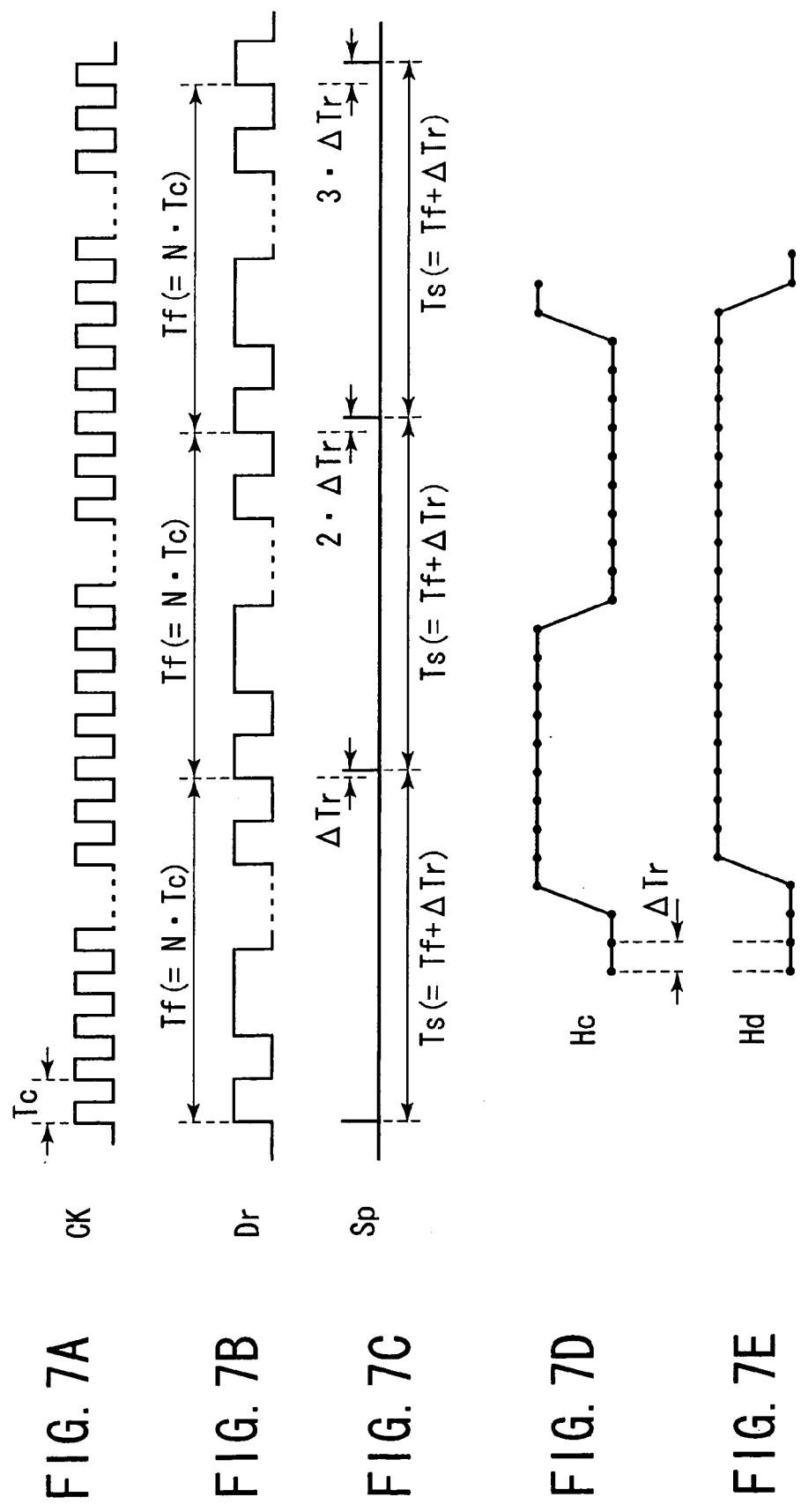
FIGS. 7A to 7E are timing charts for explanation of operations of a main portion of the jitter measuring apparatus of FIG. 6.

The sampling oscilloscope 32 is configured so as to carry out sampling for the clock signal CK and the data signal Dr to be measured inputted, for example, as shown in FIGS. 7A and 7B, at a period Ts (=K·Tf+ΔTr or =K·Tf−ΔTr) which is different by a slight time ΔTr from a period K·Tf which is K times (K is an arbitrary integer, and denotes the case of K=1 in FIG. 7) of a frame period Tf (given that a period of the clock signal CK is Tc, N·Tc) of the data signal Dt, as shown in FIG. 7C.

As shown in FIGS. 7D and 7E, the sampling oscilloscope 32 determines the waveform information Hc and Hd of the clock signal CK and the data signal Dr to be measured due to the time resolution of ΔTr.

The sampling oscilloscope 32 has an external trigger function in which acquisition of waveform information can be started from the timing which is synchronized with the level displacement timing of a signal inputted to an external trigger terminal (not showed) or which passes for an arbitrary time from the timing.

However, in a case of this type of sampling oscilloscope, a length of waveform (time range) which can be observed is determined by time resolution ΔTr and a capacity of a memory for storing waveform information, and in order to high-accurately detect a phase difference of the data signal Dr to be measured or the clock signal CK as described above, it is necessary to make time resolution ΔTr small.

Accordingly, in this type of sampling oscilloscope, it is usually difficult to acquire or averaging-process all at once one frame of waveform information of the data signal Dr to be measured.

Then, here, the acquisition start timing (acquisition range) of the waveform information of the data signal Dr to be measured and the clock signal CK are shifted by Q bits.

Note that the shifted value Q may be a value less than or equal to the bit length of the waveform in which the waveform information can be acquired and averaged by small time resolution ΔTr as described above, and greater than or equal to 1.

Shifting of the acquisition timing of the waveform information is achieved due to the frame synchronization signal S outputted from the pattern generating unit 22 being delayed as the unit of time (Q·Tc) corresponding to the Q bit length by a delay unit 33, and due to the delayed frame synchronization signal Sd being inputted to the above-described external trigger terminal of the sampling oscilloscope 32.

On the other hand, the phase difference detecting unit 25, (1) receives the waveform information of the data signal Dr' to be measured and the clock signal CK' which have been acquired and averaged by the sampling oscilloscope 32;

(2) determines Q bits of phase differences ΔT(i)', . . . ΔT(i+Q−1)' these data signal Dr' to be measured and clock signal CK';

(3) increases the delay amount of the delay unit 33 by Q bits, and shifts the acquisition region of the waveform information of the sampling oscilloscope 32 by Q bits with respect to the data signal Dr' to be measured and the clock signal CK';

(4) in this state, repeats the operation of receiving the waveform information of the data signal Dr' to be measured and the clock signal CK' which have been acquired and averaged by the sampling oscilloscope 32, and determining the phase differences ΔT(i+Q)', . . . , ΔT(i+2Q−1)' thereof; and (5) in accordance therewith, determines phase differences ΔT(1)', ΔT(2)', . . . , ΔT(N)' of one frame in the same way as in the above description.

Information of the phase differences ΔT(1)', ΔT(2)', . . . , ΔT(N)' for each bit obtained in this way are outputted to the frequency band limiting processing unit 26 in the same way as in the above description, and frequency band limiting processing determined in advance in accordance with a bit rate is applied thereto.

Then, the processed result is outputted to the measured result outputting unit 27, and the processed result is display-outputted, printed-out, or outputted to an external device, as the unit of time or UIpp units, by the measured result outputting unit 27, as pattern dependent jitter Jdp which the measuring object 1 generates with respect to the data signal Dt.

Figure 8:
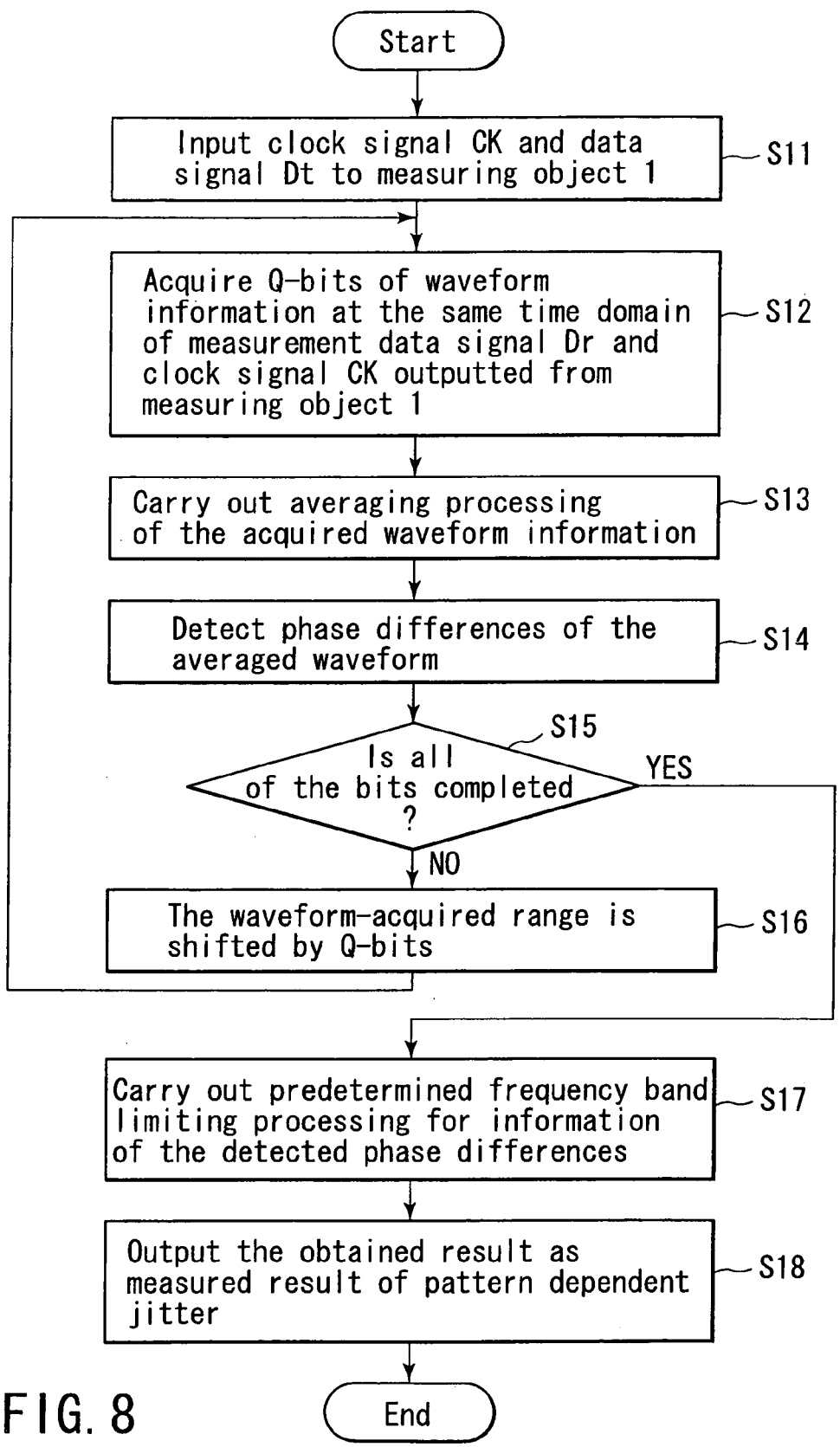
FIG. 8 is a flowchart shown for explanation of measuring processing procedure of the jitter measuring apparatus of FIG. 6.

FIG. 8 is a flowchart shown for explanation of the procedure of a method for measuring pattern dependent jitter by using the sampling oscilloscope 32 according to the second embodiment described above.

First, the clock signal CK having a predetermined frequency outputted from the clock generating unit 21 and the data signal Dt having a predetermined N bit length pattern which is outputted from the generating unit 22 and is synchronized with the clock signal CK, are provided to the measuring object 1 (step S11).

Next, Q bits of the waveform information in the same time domain of the data signal Dr to be measured and the clock signal CK which have been emitted from the measuring object 1 and Optical-Electrical converted, are acquired by the sampling oscilloscope 32 (step S12).

Next, averaging processing is carried out on the acquired waveform by the sampling oscilloscope 32, and whereby random noise jitters are eliminated (step S13).

Subsequently, Q bits of phase differences ΔT(i) of the clock signal CK' and the data signal Dr' to be measured are determined by the phase difference detecting unit 25 based on the waveforms obtained by the averaging processing (step S14).

Hereinafter, due to the processings from step S12 to step S14 being repeatedly carried out N/Q times while the waveform acquisition range is shifted by Q bits, phase differences of all bits (one frame range) are obtained (steps S15, S16).

Next, predetermined frequency band limiting processing is carried out by the frequency band limiting processing unit 26 for the one frame amount information of the phase differences (step S17).

Then, the measured result is outputted to the measured result outputting unit 27 as the pattern dependent jitter of the measuring object 1 (step S18).

Note that, as described above, in a case where the sampling oscilloscope 32 itself has a shifting function in which the acquisition timing (acquisition range) of waveform information is arbitrarily shifted, a delay unit is not provided at the exterior, and the acquisition timing of waveform information may be shifted by controlling the shifting function of the sampling oscilloscope by the phase difference detecting unit 25.

Further, in a case, as well, in which the a shifting function in which the output timing of the frame synchronization signal S is provided at the pattern generating unit 22 side, a delay unit is not provided at the exterior, and the acquisition timing of waveform information can be shifted in the same way as in the above description by controlling the function with the phase difference detecting unit 25.

Furthermore, in a case where the above-described shifting functions are provided in both of the sampling oscilloscope 32 and the pattern generating unit 22, the acquisition timing of waveform information can be shifted by controlling the both with the phase difference detecting unit 25.

For example, when the shifting function at the sampling oscilloscope 32 side can, in units of one bit, shift a number of bits up to a number of bits which is less than N (e.g., up to 16 bits) and the shifting function at the pattern generating unit 22 side can shift in units of 16 bits, the following processing is carried out: 16 bits are shifted bit-by-bit in the shift function of the sampling oscilloscope 32 side and the phase difference of each bit is determined, and thereafter, the state returns to the initial state, and after shifting of 16 bits is carried out in the shifting function of the pattern generating unit 22 side, 16 bits are again shifted bit-by-bit in the shifting function of the sampling oscilloscope 32 side and the phase difference of each bit is determined.

Moreover, when the sampling oscilloscope 32 has a function in which the phases of the two signals CK and Dr to be inputted can be relatively varied, due to the first level displacement timing of the data signal Dr to be measured being synchronized with the level displacement timing of the clock signal CK by controlling the function by the phase difference detecting unit 25, the initial phase difference ΔT(1) described above can be set to 0.

In this way, there is no need to carry out subtracting correction due to the initial phase difference ΔT(1) described above, and with respect to the following bits (the bits from thereon), a time difference of the level displacement timing of the clock signal CK and the level displacement timing (code varying timing) of the data signal Dr to be measured can be used as a phase difference as it is.

Note that, as a modified example of the jitter measuring apparatus 20' and measuring method according to the second embodiment, as shown by the broken line in FIG. 6, the case where the apparatus is configured such that the data signal Dt from the pattern generating unit 22 is directly inputted to the sampling oscilloscope 32 as the data signal Dr' to be measured without being inputted to the measuring object 1 via the output terminal 20a, can be thought.

Namely, the jitter measuring apparatus 20' according to the modified example is applied to a case where the pattern dependent jitter of the data signal Dr to be measured outputted from the measuring object 1 is not measured, and the pattern dependent jitter of the data signal Dr' to be measured is measured due to the data signal Dt from the pattern generating unit 22 in the jitter measuring apparatus 20' being made to be the data signal Dr' to be measured.

Because the jitter measuring apparatus 20' according to such a modified example is a technique applied to the case where the pattern dependent jitter of the data signal Dr' to be measured is measured due to the data signal Dt from the pattern generating unit 22 in the jitter measuring apparatus 20' being made to be the data signal Dr to be measured, namely, there is the merit that a traceability function as an internal standard can be provided therein.

(Third Embodiment)

Figure 9:
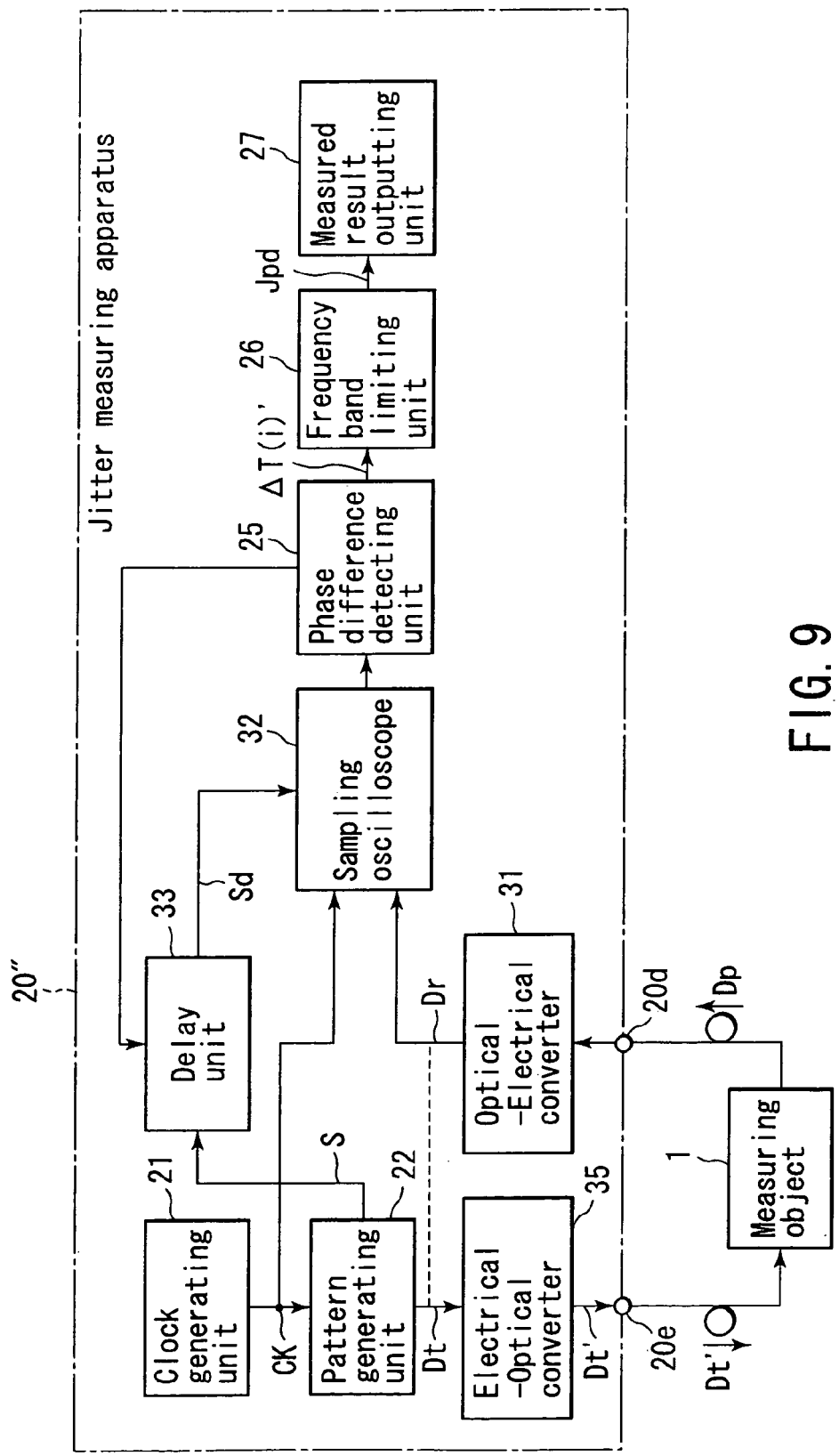
FIG. 9 is a block diagram showing a configuration of a third embodiment of a jitter measuring apparatus according to the invention.
Figure 10:
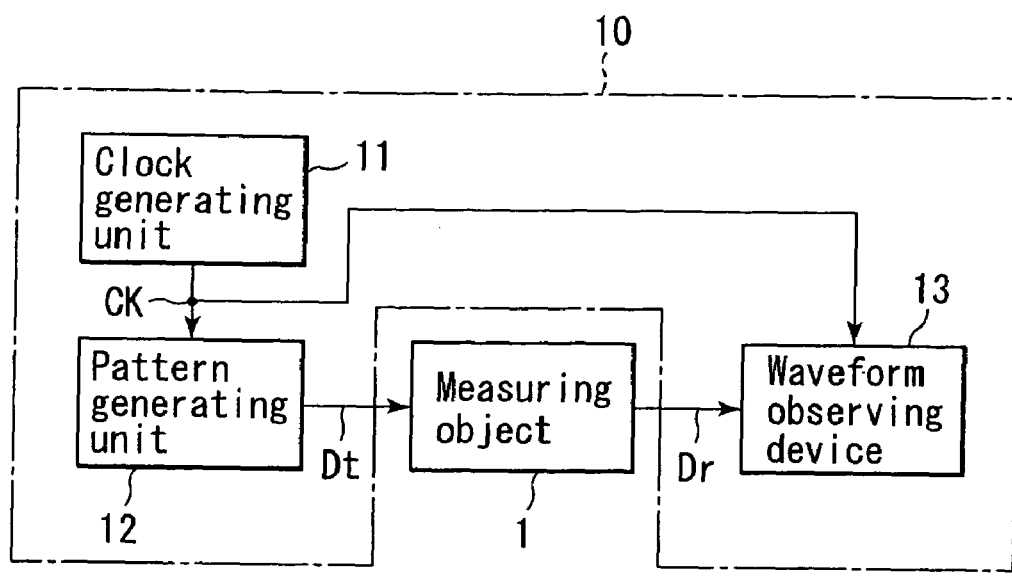
FIG. 10 is a block diagram showing a conventional jitter measuring system.
Figure 11:
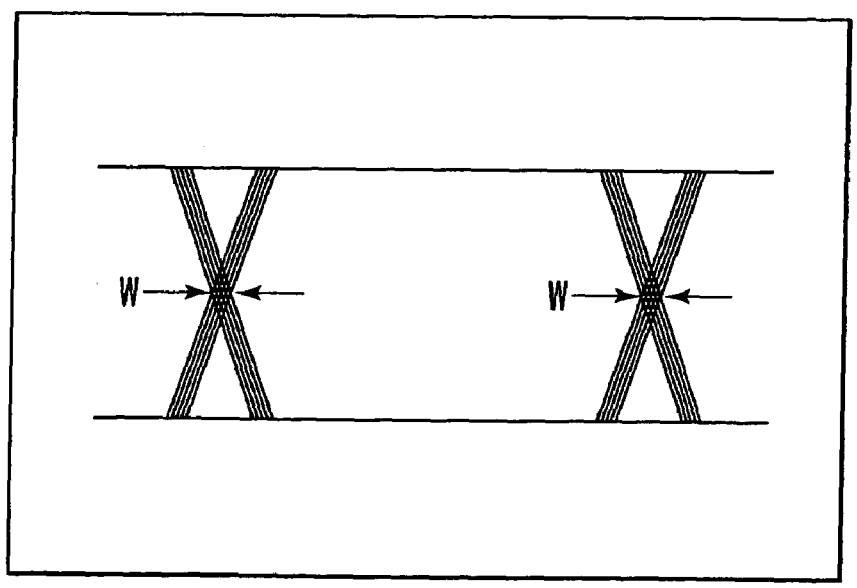
FIG. 11 is a diagram for explanation of a conventional jitter measuring method.

FIG. 9 is a block diagram showing a configuration as a third embodiment and a modified example thereof of the jitter measuring apparatus according to the invention.

In the above-described jitter measuring apparatus 20' shown in FIG. 6 according to the second embodiment, the electric data signal Dt is provided to the measuring object 1, and waveform information is acquired due to the optical data signal Dp to be measured outputted from the measuring object 1 being converted into the electric data signal Dr to be measured.

However, in a jitter measuring apparatus 20" shown in FIG. 9 in accordance with the third embodiment, the data signal Dt is converted into the optical data signal Dt' by an Electrical-Optical converter 35, and is provided to the measuring object 1 such as, for example, an optical amplifier from an output terminal 20e, and waveform information is acquired by converting the optical data signal Dp to be measured emitted from the measuring object 1 into the electric data signal Dr to be measured at the photoelectric converter 31.

Note that, in the jitter measuring apparatus 20" of the third embodiment shown in FIG. 9, portions which are the same as those of the above-described jitter measuring apparatus 20' shown in FIG. 6 according to the second embodiment are denoted with the same reference numerals, and description thereof will be omitted.

Further, in this case as well, when the sampling oscilloscope 32 has a function in which an optical signal is directly received and Optical-Electrical converted at the inside thereof, the Optical-Electrical converter 31 is omitted, and the optical data signal Dp to be measured can be directly inputted to the sampling oscilloscope 32.

Note that, as a modified example of the jitter measuring apparatus 20" and measuring method according to the third embodiment, as shown by the broken line in FIG. 9, the case where the apparatus is configured such that the data signal Dt from the pattern generating unit 22 is directly inputted to the sampling oscilloscope 32 as the data signal Dr' to be measured, without being inputted to the measuring object 1 via the Electrical-Optical converter 35 and the output terminal 20e, can be thought.

Namely, the jitter measuring apparatus 20" according to the modified example is applied to a case where the pattern dependent jitter of the data signal Dr to be measured outputted from the measuring object 1 is not measured, and the pattern dependent jitter of the data signal Dr' to be measured is measured due to the data signal Dt from the pattern generating unit 22 in the jitter measuring apparatus 20" being made to be the data signal Dr' to be measured.

Because the jitter measuring apparatus 20" according to the modified example is a technique applied to the case where the pattern dependent jitter of the data signal Dr' to be measured is measured due to the data signal Dt from the pattern generating unit 22 in the jitter measuring apparatus 20" being made to be the data signal Dr to be measured, namely, there is the merit that a traceability function as an internal standard can be provided therein.

As described above, the jitter measuring apparatus and the measuring method of the present invention measure pattern dependent jitter by acquiring waveform information in the same time domain of a data signal to be measured and a clock signal; removing the random noise jitter component by averaging the waveform information; determining, for one frame, the per-bit phase difference of the clock signal and the data signal to be measured from which the random noise jitter has been removed; and carrying out predetermined frequency band limiting processing on this phase difference information.

Therefore, the jitter measuring apparatus and the measuring method of the present invention can exactly measure only the pattern dependent jitter, which has been impossible in the eye-pattern observation of the prior art, and can easily grasp the association between a position of data and the pattern dependent jitter.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern dependent jitter measuring apparatus comprising:
   a clock generating unit which generates a clock signal having a predetermined frequency; and
   a pattern generating unit which outputs to a measuring object a data signal, which has a predetermined pattern in which one frame is configured from a predetermined bit length, so as to be synchronized with the clock signal outputted from the clock signal generating unit;

a waveform information acquiring unit which receives a data signal to be measured outputted from the measuring object as a data signal to be measured and receives the clock signal outputted from the clock generating unit, and which acquires waveform information in a same time domain of the data signal to be measured and the clock signal;

an averaging processing unit which carries out averaging processing on the waveform information acquired by the waveform information acquiring unit;

a phase difference detecting unit which determines a per-bit phase difference between the data signal to be measured and the clock signal, based on the waveform information averaged by the averaging processing unit;

a frequency band limiting processing unit which carries out predetermined frequency band limiting processing on information of the per-bit phase difference obtained by the phase difference detecting unit; and a measured result outputting unit which outputs as pattern dependent jitter the phase difference information on which the frequency band limiting processing is carried out wherein the pattern generating unit is configured to output to the waveform information acquiring unit a frame synchronization signal synchronized with data output timing at an arbitrary bit position in one frame of the data signal; and wherein the waveform information acquiring unit is configured to acquire a predetermined number of frames of the waveform information of the data signal to be measured and the clock signal by using a timing when the frame synchronization signal is inputted as a standard timing.

2. The pattern dependent jitter measuring apparatus according to claim 1, wherein the pattern generating unit is configured such that the data signal outputted therefrom includes an unscrambled specific pattern at a head position of each frame.

3. The pattern dependent jitter measuring apparatus according to claim 1, wherein the measuring object is configured such that when pattern dependent jitter is included in the data signal inputted thereto, a pattern dependent jitter component included in the inputted data signal is removable by waveform shaping processing in the measuring object, and the data signal to be measured outputted from the measuring object includes random noise jitter and pattern dependent jitter internally generated by the measuring object itself.

4. The pattern dependent jitter measuring apparatus according to claim 1, wherein the averaging processing unit is configured to determine one frame of waveform information of the clock signal and the data signal to be measured from which a random noise jitter component has been removed, by averaging the predetermined number of frames of waveform information which are acquired by the waveform information acquiring unit.

5. The pattern dependent jitter measuring apparatus according to claim 4, wherein the phase difference detecting unit determines a phase difference ΔT(i) between level displacement timing of the clock signal and a code boundary of the data signal to be measured, which is determined by the averaging processing unit and from which the random noise jitter component has been removed, and determines a per-bit phase difference ΔT(i)' as follows:

$\Delta T(1)'=0$, and $\Delta T(I)'=\Delta T(I)-\Delta T(1)$ ($i=2, 3, \ldots, N$), by correcting phase differences ΔT(2), ΔT(3), . . . , ΔT(N) from the second bit on by the phase difference ΔT(1) of the first bit.

6. The pattern dependent jitter measuring apparatus according to claim 5, wherein the phase difference detecting unit is configured such that detection of the level displacement timing is carried out after it is judged whether an amplitude of the data signal to be measured, which is determined by the averaging processing unit, exceeds a threshold value.

7. The pattern dependent jitter measuring apparatus according to claim 5, wherein the phase difference detecting unit detects timing only when a code of the data signal to be measured determined by the averaging processing unit is changed with respect to the detection of the level displacement timing, and determines a time difference between the timing and the level displacement timing as the phase difference.

8. The pattern dependent jitter measuring apparatus according to claim 5, wherein the phase difference detecting unit is configured such that, when the code of the data signal to be measured determined by the averaging processing unit is not changed with respect to the detection of the level displacement timing, the per-bit phase difference of the previous bit is allocated.

9. The pattern dependent jitter measuring apparatus according to claim 1, wherein the frequency band limiting processing unit comprises a digital filter formed by a digital signal processor.

10. The pattern dependent jitter measuring apparatus according to claim 1, wherein the waveform information acquiring unit and the averaging processing unit are formed by a sampling oscilloscope.

11. A pattern dependent jitter measuring method comprising:

outputting to a measuring object a data signal which is synchronized with a clock signal having a predetermined frequency, and which has a predetermined pattern of a predetermined bit length;

outputting a frame synchronization signal synchronized with data output timing at an arbitrary bit position in one frame of the data signal;

receiving a data signal outputted from the measuring object as a data signal to be measured, and receiving the clock signal, and acquiring waveform information in a same time domain of the data signal to be measured and the clock signal;

carrying out averaging processing on the acquired waveform information;

detecting phase differences of the data signal to be measured and the clock signal, for each bit of the data signal to be measured, based on the waveform information subjected to the averaging processing;

carrying out predetermined frequency band limiting processing on the phase difference information detected for each bit; and outputting as pattern dependent jitter the phase difference information on which the predetermined frequency band limiting processing is carried out;

wherein the acquiring of the waveform information includes acquiring a predetermined number of frames of waveform information of the data signal to be measured and the clock signal by using a timing when the frame synchronization signal is inputted as a standard timing.

12. The pattern dependent jitter measuring method according to claim 11, wherein the outputted data signal includes an unscrambled pattern at a head portion of each frame.

13. The pattern dependent jitter measuring method according to claim 11, wherein the measuring object is configured such that when the pattern dependent jitter is included in the data signal inputted thereto, a pattern dependent jitter component included in the inputted data signal is removable by waveform shaping processing in the measuring object, and the data signal to be measured outputted from the measuring object includes random noise jitter and pattern dependent jitter internally generated by the measuring object itself.

14. The pattern dependent jitter measuring method according to claim 11, wherein the averaging processing comprises determining one frame of waveform information of the clock signal and the data signal to be measured from which a random noise jitter component has been removed, by averaging the acquired predetermined number of frames of waveform information.

15. The pattern dependent jitter measuring method according to claim 14, wherein the detecting of the phase difference comprises:

detecting for each bit a phase difference $\Delta T(i)$ between level displacement timing of the clock signal and a code boundary of the data signal to be measured, which is determined by the averaging processing and from which the random noise litter component has been removed; and determining a per-bit phase difference DT(i)' as follows:

$\Delta T(1)'=0$, and $\Delta T(I)'=\Delta T(I)-\Delta T(1)$ ($i=2, 3, \ldots, N$), by correcting phase differences $\Delta T(2)$, $\Delta T(3)$, ..., $\Delta T(N)$ from the second bit on by the phase difference $\Delta T(1)$ of the first bit.

16. The pattern dependent jitter measuring method according to claim 15, wherein detection of the level displacement timing is carried out after it is judged whether an amplitude of the data signal to be measured determined by the averaging processing exceeds a threshold value.

17. The pattern dependent jitter measuring method according to claim 15, wherein the detecting of the phase difference comprises detecting timing only when a code of the data signal to be measured determined by the averaging processing is changed with respect to the detection of the level displacement timing, and determining a time difference between the timing and the level displacement timing as the phase difference.

18. The pattern dependent jitter measuring method according to claim 15, wherein when the code of the data signal to be measured determined by the equalization processing is not changed with respect to the detection of the level displacement timing, the per-bit phase difference of the previous bit is allocated.

19. The pattern dependent jitter measuring method according to claim 11, wherein the acquiring of the waveform information and the averaging processing are carried out by a sampling oscilloscope.

* * * * *